United States Patent [19]

Geipel, Jr. et al.

[11] 4,389,257
[45] Jun. 21, 1983

[54] FABRICATION METHOD FOR HIGH CONDUCTIVITY, VOID-FREE POLYSILICON-SILICIDE INTEGRATED CIRCUIT ELECTRODES

[75] Inventors: Henry J. Geipel, Jr., Essex Junction, Vt.; Ning Hsieh, San Jose, Calif.; Charles W. Koburger, III, Underhill; Larry A. Nesbit, Williston, both of Vt.

[73] Assignee: International Business Machines Corporation, Armonk, N.Y.

[21] Appl. No.: 288,608

[22] Filed: Jul. 30, 1981

[51] Int. Cl.$^3$ .................................. H01L 21/285
[52] U.S. Cl. ........................................ 148/1.5; 29/571; 156/653; 156/657; 427/89; 427/93
[58] Field of Search ................... 427/89, 93; 148/1.5; 29/571; 156/653, 657

[56] References Cited

U.S. PATENT DOCUMENTS

| | | | |
|---|---|---|---|
| 3,381,182 | 4/1968 | Thornton | 317/234 |
| 3,881,971 | 5/1975 | Greer et al. | 156/11 |
| 3,911,168 | 10/1975 | Schinella | 427/93 |
| 4,128,670 | 12/1978 | Gaensslen | 427/86 |
| 4,152,823 | 5/1979 | Hall | 29/571 |
| 4,180,596 | 12/1979 | Crowder et al. | 427/42 |
| 4,228,212 | 10/1980 | Brown et al. | 428/209 |
| 4,332,839 | 6/1982 | Levinstein | 427/89 |

OTHER PUBLICATIONS

Rideout, V. L., "Reducing the Sheet Resistance of Polysilicon Lines in Integrated Circuits", IBM Tech. Disc. Bul., vol. 17, No. 6, pp. 1831-1833 (11-74).
Baglin, J. E. et al., "Fabrication of Conductive Refractory Silicide-Doped Polysilicon Lines", IBM Tech. Discl. Bul., vol. 20, No. 10, p. 4189 (3-78).
Howard, J. K. "Gate for MOS Devices: Rare Earth Silicides", IBM Tech. Discl. Bul., vol. 21, No. 7, pp. 2811-2813 (12-78).
Zirinsky, S. et al., "Oxidation Mechanisms in WSi$_2$ Thin Films", Appl. Phys. Lett., vol. 33, No. 1, 1 Jul. 1978, pp. 76-78.
Crowder, B. L., et al., ". . . Metal Silicide Interconnection Technology—A Future Perspective", IEEE J. Sol-St. Cir., vol. SC-14, No. 2, pp. 291-293 (4-79).
Murarka, S. P., "Refractory Silicides for Low Resistivity Gates and Interconnects", IEDM 1979, Tech. Dig. Paper 20.1, pp. 454-457 (12-03-79).
Hsieh, N. et al., "Oxidation Induced Voids in Polysilicon/Silicide Films", Spring Meeting, Electrochem. Soc., vol. 80-1, Abs. 161, pp. 425-427 (5-11-80).
Koburger, C. et al., "Electrical Properties of Composite Silicide Gate Electrodes", Spring Meeting, Electrochem. Sol., vol. 80-1, Abs. 162, pp. 428-430 (5-11-80).

Primary Examiner—John D. Smith
Attorney, Agent, or Firm—Howard J. Walter, Jr.

[57] ABSTRACT

A method of providing self-passivating interconnection electrodes for semiconductor devices which provides low resistivity composite polysiliconsilicide electrodes. In the method the formation of oxidation induced voids in polysilicon underlying the silicide is eliminated by deposition of polysilicon and stoichiometric proportions of silicon and a silicide-forming metal. These steps are followed by deposition of a silicon layer having a thickness determined to provide between 30 and 100 percent of the silicon required to form a silicon dioxide passivation layer. Subsequent thermal oxidation of the layered electrode structure provides a self-passivated structure useful for fabrication of silicon gate MOSFET devices as well as other integrated circuit structures.

15 Claims, No Drawings

FABRICATION METHOD FOR HIGH CONDUCTIVITY, VOID-FREE POLYSILICON-SILICIDE INTEGRATED CIRCUIT ELECTRODES

BACKGROUND OF THE INVENTION

1. Field of the Invention

This invention relates to fabrication methods for integrated circuit electrode structures and particularly to techniques for providing high conductivity polysilicon electrodes for self-aligned gate MOSFET devices.

2. Description of the Prior Art

The development of integrated circuit technology has lead to the use of ever decreasing lithographic dimensions and vertical device scaling to provide higher levels of integration. The inherent resulting relative increase in propagation delay has placed great importance on interconnection technology, particularly when multiple levels of interconnection metallurgy are used. Polycrystalline silicon (polysilicon) has been extensively used in MOSFET technologies because of its high temperature stability and its ability to provide a stable self-passivation insulation by direct oxidation. One undesirable characteristic of polysilicon is its relatively high resistivity, on the order of 500 microohm-cm.

Three alternatives to polysilicon interconnect technology have been previously proposed and extensively investigated. Refractory metals such as molybdenum and tungsten, because of their high conductivity, an order of magnitude greater than polysilicon, have been proposed but lack the important ability to provide a stable self-passivating oxide. Alternately, refractory metal silicides have also been proposed, as silicides have relatively high conductivity, high melting points, small grain size and are compatible with silicon dioxide insulating films. Silicides, however, have a limited capability for self-passivation. A third alternative, preserving the electrical interface properties of polysilicon and providing high conductivity of the refractory metal systems was proposed by Rideout, IBM Technical Disclosure Bulletin, November 1974, at pp. 1831-3. In this technique, a layer of silicide forming metal is deposited on previously defined polysilicon gate electrodes to locally form a silicide layer only on the exposed polysilicon. Passivation is achieved by chemical vapor deposition of a layer of silicon dioxide.

An improvement in Rideout's technique is taught in U.S. Pat. No. 4,180,596 to Crowder and Zirinsky in which a refractory metal and silicon are co-evaporated to form a discrete silicide layer, either on silicon dioxide or polysilicon, prior to definition of electrodes. After etching of the desired electrode pattern, the silicide/-polysilicide or "polycide" structure is oxidized to provide a silicon dioxide passivation layer. Further experimentation with polycides indicated that the reaction mechanism for the oxidation of polycides was due to the diffusion of silicon from the underlying polysilicon through the silicide layer as opposed to oxidation of the silicides directly, as reported by Zirinsky et al in Applied Physics Letters, Vol. 33, No. 1, July 1, 1978, at pp. 76-78. The application of polycide to MOSFET devices has been described in the IEEE J. Solid-State Circuits, Vol. SC-14, No. 2, April 1979, pp. 291-293.

U.S. Pat. No. 4,128,670 to Gaensslen teaches another method for forming polysilicon-silicide interconnection metallurgy in which sequential layers of polysilicon, a silicide forming metal and polysilicon are deposited over a thin gate dielectric within a single deposition chamber. After definition of electrode patterns the layered structure is exposed to a reoxidation process which simultaneously causes the formation of a layer of silicide intermediate of the two polysilicon layers and also causes the top layer of polysilicon to become partially oxidized. The resulting structure includes gate oxide, polysilicon, silicide, polysilicon and oxidized polysilicon. We have found that such in situ formation of a silicide does not provide optimum high conductivity because of the formation of various silicide phases and the presence of excess free silicon in the structure. The patent does not describe a process in which the thicknesses of the as-deposited layers are specified.

A similar deposition technique in which sequential layers of polysilicon, a refractory metal (titanium) and polysilicon was described by Murarka at the 1979 International Electron Devices Meeting, Washington, D.C., Dec. 3-4-5, 1979, in paper 20.1. Although the purpose of the upper polysilicon is not described in this paper, a subsequent article by Murarka et al, IEEE Transactions on Electron Devices, Vol. ED-27, No. 8, August 1980, pp. 1409-17, indicates that the upper polysilicon was originally intended to provide an etch-resistant protective layer against hydrofluoric acid containing solvents. Experimental results, however, indicated that the desired protection was lost during high temperature processing which caused the upper polysilicon to diffuse through the titanium silicide layer. This not only eliminated the protective layer but also increased the resistivity of the silicide.

Additional, multiple layer polysilicon and silicide-forming metal structures are taught by Howard in IBM Technical Disclosure Bulletin, Vol. 21, No. 7, December 1978, pp. 2811, which describes the use of rare earth silicides to form polycide gate electrodes for MOSFET devices.

In the article, "Oxidation Induced Voids in Polysilicon/Silicide Films," by co-inventors Hsieh and Nesbit, presented at the Spring Meeting of the Electrochemical Society, St. Louis, Mo., May 11-16, 1980, Abstract No. 161, it was reported that the oxidation of polycide structures was found to produce voids in the underlying polysilicon due to the rapid diffusion of silicon through the silicide during oxidation. The presence of such voids seriously impacts the reliability of MOSFET devices using polycide gate structures.

In a related paper by Ishaq and co-inventors Koburger and Geipel, Spring Meeting of the Electrochemical Society, St. Louis, Mo., May 11-16, 1980, Abstract No. 162, the gate dielectric breakdown voltage for oxidized polycide gate MOSFET was shown to be dependent upon the thickness of the polysilicon underlying the silicide layer.

Additional references related to polysilicon/silicide-forming metal electrode systems include U.S. Pat. No. 3,381,182 to Thornton which generally teaches the oxidation of a polysilicon layer over a refractory metal or silicide layer for purposes of passivating conductive lines buried in a substrate. U.S. Pat. No. 4,228,212 to Brown et al teaches a method of providing an oxide passivated refractory metal line by depositing polysilicon over a predefined metal line, heating to form a silicide and then oxidizing the polysilicon and a part of the silicide layer to form a passivating layer.

Additional uses of polysilicon in interconnection metallurgy systems are taught in U.S. Pat. No. 3,881,971 to Greer et al which describes a process which includes deposition of silicon on an aluminum layer followed by deposition of a passivating layer of insulating material, in order to presaturate the aluminum with silicon to prevent spiking of aluminum in pn-junctions, and U.S. Pat. No. 4,152,823 to Hall which teaches a metallurgy system including sequentially deposited layers of silicon, refractory metal and silicon in order to provide a silicon interface between the metallurgy and the underlying silicon substrate and between an overlying aluminum line.

SUMMARY OF THE INVENTION

Accordingly, it is an object of this invention to provide high conductivity interconnection lines for silicon gate MOSFET devices having desirable characteristics of both polysilicon gate electrodes as well as refractory metal gate electrodes.

Another object is to provide highly reliable gate electrodes for MOSFET devices in which the presence of polysilicon voids is substantially reduced.

These and other objectives are achieved by the invention through a sequence of process steps in which an oxidizable layer of silicon is provided over a polysilicon/silicide structure followed by an oxidation step which consumes all of the oxidizable layer of silicon. The resulting structure includes a layer of polysilicon having a thickness greater than 100 nanometers, a layer of intermetallic compound silicide and a layer of silicon dioxide, the silicon source of which is provided by the oxidizable layer and the underlying layers. The thickness of the upper oxidizable silicon layer is dependent on the desired thickness of silicon dioxide and provides between 30 and 100 percent of the required silicon.

DESCRIPTION OF THE PREFERRED EMBODIMENT

The method of the present invention is applicable to the formation of films for the interconnection of integrated circuit elements which are capable of sustaining various processing environments found in silicon-gate MOSFET processing technology. Although, various silicide-forming metals have been proposed for use in MOSFET processing, see for example those indicated in the articles by Murarka and Howard, cited above, preferred metals include cobalt, molybdenum, niobium, rhodium, tantalum, titanium and tungsten, as their silicide formation temperatures are less than 1000° C., typical of temperatures normally used in semiconductor processing, while the melting points of their disilicides are in excess of 1200° C., a temperature not normally exceeded in semiconductor processing. Tungsten and molybdenum are particularly preferred because of their low resistivity and their compatability with conventional semiconductor processing.

Although various deposition techniques such as chemical vapor deposition, sputtering and evaporation have been proposed for deposition of silicide forming metal and silicides, evaporation by electron beam heating of source materials is preferred for its ability to control film stoichiometry and contamination levels at vacuum levels used, typically about $1 \times 10^{-6}$ torr. Other techniques have been found to provide inferior films.

The co-evaporated silicide-forming metal and silicon are preferably accomplished in a dual electron beam evaporation unit. Deposition rates for silicon are preferred to be about 0.47 to 0.52 nanometers per second, as rates much beyond these increase the probability of irregular evaporation resulting from localized overheating and bubble formation. Metal deposition rates of about 0.2 nanometers per second enable stoichiometric ratios to be deposited.

Although adequate film properties may be achieved without substrate preheating, it is preferred, particularly for tungsten-silicon deposition, to preheat the substrates to 300° C. before deposition. Preheating temperatures up to about 350° C. may be used.

The as-deposited metal-silicon films are amorphous and require a brief thermal anneal, for example 30 minutes at 1000° C., in order to cause homogenization and recrystallization of the silicide to provide a stabilized low-resistivity state. An inert environment of argon or nitrogen has been found adequate to lower the as-deposited resistivity from greater than 200 microohm-cm to about 30–50 microohm-cm. Although a thermal oxidation environment could provide annealing, it is preferable to use a separate anneal prior to the etching of the deposited layers in order to improve the etching characteristics of the films.

According to the invention, self-passivating composite silicon-silicide conductive electrodes for field effect devices are formed by the following process sequence.

P-type silicon wafers having a resistivity of 12 ohm-cm are provided with a semi-recessed field oxide and about 25–45 nm of thermal silicon dioxide gate insulator using a standard oxygen-HCl atmosphere.

Phosphorus in situ-doped polysilicon is provided by low pressure chemical vapor deposition to a thickness of about 200 nm from silane and phosphine in nitrogen. The thickness of the initial or first polysilicon layer is dependent upon the desired thickness of the self-passivating oxide to be subsequently grown and the thickness of the second or capping silicon layer used. The criterion being that the ultimate remaining thickness of the first silicon layer in the passivated structure should be greater than 100–200 nm required for good gate insulator breakdown voltage. A useful range of doped polysilicon thickness is 150 to 250 nm. The polysilicon may also be deposited as intrinsic silicon followed by doping.

Although we had previously demonstrated that sequential evaporation of intrinsic silicon followed by co-deposition of metal and silicon did not produce voids in the underlying silicon upon evaporation, we are presently unable to provide the required conductive doped-polysilicon by such a process.

Following the formation of the conductive first silicon layer, tungsten and silicon are co-evaporated in a substantially stoichiometric ratio for tungsten disilicide to a thickness of about 150 to 350 nm. The use of a stoichiometric ratio is based on experimentation which indicated that this ratio provides the lowest sheet resistance for the resultant silicide. We also found that a thicker thermal oxide could be grown if the co-deposited layer contained excess silicon or excess tungsten, that is if the ratio of silicon to metal varied on either side of the stoichiometric ratio, and that an increase in thermally grown oxide dielectric strength could be achieved with a tungsten-rich ratio. The actual ratio found under evaporation conditions of 0.5 nm per second silicon and 0.2 nm per second tungsten was determined by microprobe analysis to be 70 atomic (26 weight) percent silicon compared with the stoichiometric ratio of 66.7 atomic (23.4 weight) percent silicon.

After co-evaporation of the metal-silicon layer, a layer of silicon is provided by turning off the tungsten source without breaking the vacuum in the deposition chamber. The thickness of the second silicon layer, although dependent on the desired passivating oxide thickness, is in the range of 10 to 100 nm. The preferred thickness is about 80 nm, or that thickness required to grow about 80 percent of the passivating oxide.

Next, it is perferred to expose the substrates to a 15 to 30 minute anneal in argon or nitrogen between 600° and 1000° C. This step causes the co-deposited layer to chemically form the disilicide, densify and reduce any compositional fluctuations in the silicide layer. The inert anneal step performed after the evaporation steps and before etching of electrode patterns is also helpful to improve the etchability of the silicide film.

After annealing, standard photolithographic processing steps are used to define the electrode pattern desired. Etching is preferably performed by a dry plasma etch process using a $CF_4$ and oxygen plasma in either a tube or parallel-plate reactor.

Source and drain regions are next ion implanted, preferably using arsenic as the dopant species at an energy of 80 Kev and a dose of $4-8 \times 10^{15}/cm^2$. A short thermal anneal in nitrogen, about 10 minutes at a temperature between 900° and 1100°, preferably at 1000° C., is performed to reduce the concentration profile of arsenic in the second silicon layer in order to provide better oxidation characteristics. This is followed immediately by a source-drain reoxidation step in order to grow a predetermined thickness of silicon dioxide on the polycide structure. Typically, a dry-wet thermal oxidation process of about 10-22-30 minutes is used followed by a 45 minute anneal in nitrogen, all at 1000° C.

In the preferred structure with 200 nm doped polysilicon, 200 nm silicide and 80 nm silicon, the thickness of the passivating oxide is about 200 nm, about 160 nm of which is provided by the second silicon layer and the remainder provided by free silicon in the silicide and the underlying doped polysilicon layers.

We have found that a practical minimum thickness for the second silicon layer is that thickness needed to provide about 30 percent of the silicon for the passivating oxide layer. Providing less than about 30 percent of the required silicon for oxidation tends to encourage formation of voids in the doped polysilicon layer reducing reliability. If too thin a layer is used, it also may diffuse into the silicide layer and be incorporated as silicide or free silicon, as was observed in the Murarka et al article, cited above.

The maximum thickness of the second silicon layer is limited by subsequent processing steps where it is necessary to make contact to the polycide layer with overlying metallurgy. If less than all of the second silicon layer is oxidized the residual silicon thickness over the silicide will not be etched when contact vias are provided through the passivating layer. Leaving the residual silicon layer in place will increase the contact resistance between the silicide and overlying metallurgy by a factor of 3-5 times that found for metal to silicide. Selective removal of residual silicon in via holes is impractical as the etch rates of silicon and silicide are similar in a single etchant and use of multiple selective etchants adds to process complexity.

In summary, a method has been described which enables the implementation of highly conductive polycide metallurgy in polysilicon gate MOSFET processing which provides a highly reliable structure by the elimination of the formation of voids in polysilicon layers formed under the silicide layer. The suitability of the process in a manufacturing environment is evident by the ability of the structure to be self-passivating, to provide low resistivity and to provide low contact resistance to overlying levels of metallurgy.

What is claimed is:

1. The method of providing self-passivated composite silicon-silicide conductive electrodes for field effect devices including the steps of:
   providing a semiconductor substrate of a first conductivity type;
   providing a gate dielectric layer on said substrate;
   providing a conductive first silicon layer on said gate dielectric layer;
   sequentially depositing over said first silicon layer a layer comprising a silicide-forming metal and a second silicon layer, and
   exposing said layered structure to a thermally oxidizing atmosphere to grow a predetermined thickness of silicon dioxide on said structure;
   the improvement characterized in that the step of depositing said silicide-forming metal includes the simultaneous co-deposition of silicon and said silicide-forming metal in a substantially stoichiometric ratio to form an alloy layer having the composition of an intermetallic metal compound silicide and that the thickness of said second silicon layer provides between 30 and 100 percent of the silicon required to grow said predetermined thickness of silicon dioxide during said oxidation step, the balance of the silicon required to grow said predetermined thickness being provided by said first silicon layer.

2. The method of claim 1 wherein said co-deposited layer has a thickness between 100 and 350 nanometers.

3. The method of claim 1 wherein the thickness of said first silicon layer is greater than 100 nanometers, and the thickness of said second silicon layer is between 10 and 100 nanometers.

4. The method of claim 1 wherein said silicide-forming metal is selected from the group consisting of cobalt, molybdenum, niobium, rhodium, tantalum, titanium and tungsten.

5. The method of claim 1 wherein said second silicon and said co-deposited layers are blanket deposited and further wherein said layers are selectively etched to form patterned electrodes prior to exposing said layered structure to said oxidizing atmosphere.

6. The method of claim 5 wherein opposite conductivity type regions are formed in said substrate adjacent to at least portions of said patterned electrodes prior to exposing said substrate to said oxidizing atmosphere.

7. The method of claim 5 wherein said substrate is heated to a temperature between 600° and 1100° C. to anneal said alloy layer prior to the step of selectively etching said layer.

8. The method of claim 6 wherein said opposite conductivity regions are formed by ion implantation of arsenic ions into said substrate.

9. The method of claim 8 wherein said substrate is heated to a temperature of between 900° and 1100° C. after ion implantation of arsenic and prior to exposing said substrate to said thermally oxidizing atmosphere.

10. The method of claim 1 wherein said co-deposited layer is formed by co-evaporation of silicon and said silicide-forming metal.

11. The method of claim 10 wherein said co-evaporation is performed after preheating said substrate to between 25° and 350° C.

12. The method of claim 11 wherein said silicide forming metal is tungsten and wherein said substrate is preheated to about 300° C.

13. The method of claim 1 wherein the steps of co-depositing said alloy layer and depositing said second silicon layer are sequentially performed within a single deposition chamber without interruption.

14. The method of claim 1 wherein said substrate is heated to a temperature between 600° and 1100° C. to anneal said alloy layer after the deposition of said alloy layer and before exposing said substrate to said oxidizing atmosphere.

15. The method of claim 14 wherein said temperature is about 1000° C.

* * * * *